United States Patent
Harima

(10) Patent No.: US 8,836,441 B2
(45) Date of Patent: Sep. 16, 2014

(54) SURFACE MOUNT PIEZOELECTRIC OSCILLATOR

(71) Applicant: Nihon Dempa Kogyo Co., Ltd., Tokyo (JP)

(72) Inventor: Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 38 days.

(21) Appl. No.: 13/726,206

(22) Filed: Dec. 23, 2012

(65) Prior Publication Data

US 2013/0162362 A1 Jun. 27, 2013

(30) Foreign Application Priority Data

Dec. 27, 2011 (JP) ................................. 2011-285402
Oct. 17, 2012 (JP) ................................. 2012-229794

(51) Int. Cl.
*H03B 5/32* (2006.01)
*H01L 41/053* (2006.01)
*H03H 9/05* (2006.01)
*H03H 9/10* (2006.01)

(52) U.S. Cl.
CPC ............... *H03B 5/32* (2013.01); *H03H 9/0552* (2013.01); *H03H 9/1021* (2013.01)
USPC ............ 331/154; 310/344; 310/348; 310/368

(58) Field of Classification Search
USPC ......... 310/311, 315, 340, 344, 348, 349, 368, 310/370; 331/154–156, 158
See application file for complete search history.

(56) References Cited

U.S. PATENT DOCUMENTS

| | | | | |
|---|---|---|---|---|
| 5,405,476 A | * | 4/1995 | Knecht | 156/292 |
| 6,049,256 A | * | 4/2000 | Fry | 331/69 |
| 6,304,151 B1 | * | 10/2001 | Uehara et al. | 331/108 D |
| 6,998,925 B2 | * | 2/2006 | Harima et al. | 331/68 |
| 7,023,288 B2 | * | 4/2006 | Takanashi et al. | 331/108 D |
| 7,242,258 B2 | * | 7/2007 | Hatanaka et al. | 331/68 |
| 7,602,107 B2 | * | 10/2009 | Moriya et al. | 310/348 |
| 2008/0067892 A1 | * | 3/2008 | Chiba et al. | 310/314 |
| 2010/0079035 A1 | * | 4/2010 | Matsuzawa et al. | 310/340 |
| 2010/0156546 A1 | * | 6/2010 | Harima | 331/68 |
| 2013/0135055 A1 | * | 5/2013 | Harima | 331/116 R |

FOREIGN PATENT DOCUMENTS

| | | |
|---|---|---|
| JP | 2004-180012 | 6/2004 |
| JP | 2004-296455 | 10/2004 |

* cited by examiner

*Primary Examiner* — Levi Gannon
(74) *Attorney, Agent, or Firm* — Jianq Chyun IP Office

(57) ABSTRACT

A surface mount piezoelectric oscillator includes a piezoelectric resonator with a container main body, a plurality of external terminals, a mounting board with an IC chip, a plurality of connecting terminals, and a solder ball. The solder ball bonds the plurality of external terminals and the plurality of connecting terminals by melting and hardening. The solder bonding portion has approximately a circular shape with approximately a same size as a size of the connecting terminal of the mounting board. The solder ball placed on the connecting terminal of the mounting board is melted, self-aligned, and hardened so as to form a solder fillet of nearly axial symmetry. The solder fillet bridges between the both electrodes and bonds the connecting terminal of the mounting board and the solder bonding portion of the external terminal of the piezoelectric resonator.

5 Claims, 7 Drawing Sheets

SURFACE MOUNT PIEZOELECTRIC OSCILLATOR

CROSS REFERENCE TO RELATED APPLICATIONS

This application claims the priority benefit of Japan application serial no. 2011-285402, filed on Dec. 27, 2011, and 2012-229794, filed on Oct. 17, 2012. The entirety of each of the above-mentioned patent applications is hereby incorporated by reference herein and made a part of this specification.

TECHNICAL FIELD

This disclosure relates to a piezoelectric oscillator, and in particular, relates to a surface mount piezoelectric oscillator where a piezoelectric resonator is connected to an integrated circuit chip (an IC chip) via a low melting point metal material such as a solder ball. The IC chip constitutes an oscillator circuit together with the piezoelectric resonator.

DESCRIPTION OF THE RELATED ART

A portable information terminal such as a mobile phone and a so-called tablet, or various kinds of vehicle electronic equipment has become a popular electronic device. At the same time, most of the electronic components mounted on these kinds of equipment have employed downsized and low-profile components called surface mounting devices. The surface mounting device includes a flat connecting terminal (a surface mount terminal) disposed on a venter surface (a surface facing the mounting board) of the surface mounting device. The surface mounting device is bonded on a terminal pad (also called a land or land pattern) on a surface of the mounting board in surface to surface connection via a solder film.

A general piezoelectric material includes crystal. Here, a description will be given of a piezoelectric resonator as a quartz crystal unit and a piezoelectric oscillator with a quartz crystal unit as a crystal oscillator. However, the disclosure is not limited to these piezoelectric oscillators. The disclosure is similarly applicable to a component related to a piezoelectric component such as a SAW (surface acoustic wave) filter, various electronic circuit components including a bonding structure using a low melting point metal material such as a solder ball inside or outside of the components.

An exemplary crystal oscillator described here is small in size and lightweight. Accordingly, the crystal oscillator is surface mounted on various pieces of electronic equipment such as mobile equipment as a frequency reference source or a time reference source. The crystal oscillator is used alone or included in another circuit. Recently, there has been a need to consider strong solder bonding structure to prevent solder crack and damage on a board or a main body of a component in electronic equipment such as vehicle equipment, where impacts occur and the environment temperature changes considerably. The solder crack or damage is caused by a difference in thermal expansion due to secular change or heat cycle, or stress variation such as board warpage due to an external force.

FIG. 7 is a schematic cross-sectional view illustrating an exemplary configuration of the crystal oscillator as an example of a surface mount piezoelectric oscillator according to a conventional technique. This crystal oscillator 1 includes a quartz crystal unit 2 and a mounting board 3 with an IC chip 33. The quartz crystal unit 2 includes a container main body that includes a bottom wall layer 21 and a frame wall layer 22, which are preferred to employ ceramic material. The container main body houses a crystal element 24 in a depressed portion surrounded by the frame wall layer 22. The crystal element 24 has excitation electrodes (not shown) on both surfaces of the thin piece of crystal. Extraction electrodes (similarly, not shown) extending from the excitation electrodes to end edges are fixedly secured to a pair of crystal holding terminals 26 with a conductive adhesive 25. The pair of crystal holding terminals 26 is disposed on an inner bottom surface (one principal surface) of the depressed portion.

The depressed portion housing the crystal element 24 is hermetically sealed by a lid body 23 formed of a metal plate, thus forming the quartz crystal unit 2. The lid body 23 and the frame wall layer 22 are sealed by seam welding or similar method via a metal film (described below) that employs the same type of material as that of the lid body 23. The lid body 23 can employ a non-metal material such as a quartz plate, a ceramic plate, a hard resin plate, or a similar plate. The bottom wall layer 21 has an outside bottom surface (the other principal surface) on which external terminals 27 are disposed. The external terminal 27 is disposed for connecting to a connecting terminal 36 on the mounting board 3 with the IC chip 33 via a metal material such as a solder ball (hereinafter referred to as a solder ball). The external terminal 27 is electrically connected to the crystal holding terminal 26 through a via hole 30 or the like that passes through the bottom wall layer 21.

In this example, the mounting board 3 with the IC chip 33 employs a laminated substrate formed of a ceramic substrate 31 and ceramic substrate 32. The mounting board 3 is not limited to this laminated substrate and may employ a single layer substrate. One principal surface (an IC chip mounting surface) of the mounting board 3 includes the plurality of connecting terminals 36 that connect a wiring pattern to a plurality of electrode pads 35 and the external terminal 27 of the quartz crystal unit 2. The mounting board 3 has the other principal surface (the mounting surface) on which a plurality of mounting terminals 37 is disposed for surface mounting a circuit board of the electronic equipment for being applied. In this example, a ground layer 38 (a shield layer) that provides an electromagnetic shielding function is interposed between the ceramic substrate 31 and the ceramic substrate 32. The ground layer 38 is connected to a ground pattern (not shown).

The IC chip 33 is fixedly secured to an electrode pad 35 via its mounting bump 34 (such as a solder bump or gold bump) by ultrasonic thermo-compression bonding or similar method. Further, an adhesive layer, which is preferably an epoxy resin, or an adhesive layer referred to as an underfill layer 39 is filled between the IC chip 33 and the mounting board 3. FIG. 7 illustrates the underfill layer 39 or the like, which is filled only within the region of the electrode pad 35 to avoid providing an overly complex drawing. However, the underfill layer 39 is generally disposed on the whole area between the IC chip 33 and the mounting board 3 (similar in the following drawings).

The mounting board 3 with the IC chip 33 and the quartz crystal unit 2 are bonded together as follows. The external terminal 27 of the quartz crystal unit 2 is positioned corresponding to a solder ball 4 disposed on the connecting terminal 36. The solder ball 4 is melted in a solder reflow process, and then the melted solder hardens to bond. The solder ball 4 mainly includes tin (Sn)/silver (Ag), tin (Sn)/silver (Ag)/copper (Cu), tin (Sn)/silver (Ag)/copper (Cu)/nickel (Ni), or similar component. The solder ball 4 is melted in a reflow, and the melted solder hardens for bonding the external terminals 27 of the quartz crystal unit 2 to the connecting terminals 36 of the mounting board 3. In some oscillators, the other principal surface of the quartz crystal unit 2 is bonded to the IC chip via an adhesive 28 such as epoxy resin. Japanese Unexamined Patent Application Publication No. 2004-180012 discloses this kind of oscillator.

Japanese Unexamined Patent Application Publication No. 2004-296455 (hereinafter referred to as Patent Literature 2) discloses a crystal oscillator. The crystal oscillator employs a solder bonding where a spherical conductor is interposed between an external connection terminal of a quartz crystal unit and a mount pad of a wiring board with a discrete components. Patent Literature 2 discloses a solution in the case where both a frequency measurement terminal of the quartz crystal unit and a connection function of the wiring board are provided to the external connection terminals, which have different shapes such as an approximately rectangular shape disposed in the quartz crystal unit. Here, the frequency measurement terminal requires a certain area size to contact a probe. Further, stress is applied unevenly after solder bonding with the spherical conductor interposed for avoiding a problem of a crack in a solder part due to the uneven stress.

Patent Literature 2 discloses a method to solve the above-described problem. A circular pattern similar to the outer shape of the spherical conductor is formed at the part opposed to the spherical conductor in the above-described external connection terminal with the different shape of the quartz crystal unit. The circular pattern becomes a solder bonding portion with the spherical conductor. The circular pattern is electrically connected to the external connection terminal outside of a part of or all of the circular patterns through a via hole conductor disposed inside of the wiring board. Patent Literature 2 discloses a spherical conductor where solder is coated to a core of a spherical body made of a material such as a resin or copper. The spherical conductor is interposed between the external connection terminal of the quartz crystal unit and the mount pad of the wiring board. Then, an interval between the both is adjusted by the core diameter. Thus, the both are bonded by melting and hardening of the solder coated around the core.

The solder bonding portion is formed on the mount pad of the wiring board that is bonded on the spherical conductor. The solder bonding portion is surrounded by a non-conductive body region and has an area approximately the same shape as an area of a bisected cross-sectional surface of the spherical conductor. This avoids generation of a crack by equalizing the stress to the solder on the mount pad after solder bonding. Additionally, this ensures an electrode area on which a probe contacts, thus avoiding generation of a crack by equalizing the stress after solder bonding.

The above-described non-conductive body region is formed to be an unbaked region of tungsten, a baked region of alumina coating, a printed region of solder resist, or an applied region of a photosensitive resin in the external connection terminal. That is, the non-conductive body region has an effect that prevents the melted solder of the spherical conductor at a reflow process from leaking from the above-described solder bonding portion to the outside.

As described above, in the crystal oscillator 1, a solder ball 4 is disposed on the connecting terminal 36 of the mounting board 3 with the IC chip 33 so as to connect the quartz crystal unit 2. The solder ball 4 is temporarily fixed with a solder flux applied on the connecting terminal 36. The solder ball 4 is melted by a reflow process to bond the connecting terminal 36 to the external terminal 27 of the quartz crystal unit 2. When the melted solder hardens, the connecting terminal 36 and the external terminal 27 are bonded. The following situation may occur with a structure where the external terminal of the quartz crystal unit and the connecting terminal of the IC chip are bonded with the solder ball inside the element.

In the crystal oscillator 1 where the quartz crystal unit 2 is connected to the mounting board 3 with the IC chip 33 using the solder ball 4, an area of the external terminal 27 of the quartz crystal unit 2 is generally larger than the area of the connecting terminal 36 of the mounting board 3. A melted solder has a property where it spreads and wets a metal surface that forms a terminal. Accordingly, when the external terminal 27 of the quartz crystal unit 2 is connected to the solder ball 4 that is temporarily fixed to the connecting terminal 36 of the mounting board 3, and a reflow process is performed, the melted solder spreads and wets the surface of the external terminal 27 of the quartz crystal unit 2. The spread and wet is remarkable on the external terminal 27 side with large area. Most of the spread and wet solder will be attracted to the surface side of the external terminal 27 and does not connect the terminals well, resulting in deterioration of connecting strength.

In the reflow process, if the reflow has temperature gradient, or a positioning gap occurs between the connecting terminal 36 and the external terminal 27, the melted solder is unevenly attracted to the side of the external terminal 27 with large area of the quartz crystal unit 2. This may cause a shortage in the amount of local solder and variation of bonding strength, resulting in poor bonding.

FIGS. 8A to 8C are schematic views illustrating a typical example of poor bonding state in a reflow bonding of the solder ball that connects the quartz crystal unit to the mounting board with the IC chip in the configuration in FIG. 7. FIG. 8A illustrates a state where the solder pillar 40 melted between the external terminal 27 of the quartz crystal unit 2 and the connecting terminal 36 of the mounting board 3 forms an irregular form of fillet biased to one side.

FIG. 8B illustrates a case where the quartz crystal unit 2 and the mounting board 3 are in a reflow furnace with their positions shifted. Even if a temperature gradient does not occur (if the solder ball is uniformly heated and equally melted), the melted solder pillar 40 is attracted to the external terminal 27 with large area of the quartz crystal unit 2. The melted solder pillar 40 spreads and wets the external terminal 27 and forms an irregular form of solder fillet biased to one side. FIG. 8C illustrates a state where a gas remains in the melted solder pillar 40, the solder hardens, and a void 44 is formed.

These types of bonding reduce the reliability of bonding between the quartz crystal unit 2 and the mounting board 3, thus degrading reliability in the crystal oscillator. In order to avoid the conditions where the melted solder is attracted to the external terminal side with large area as described above, the external terminal 27 of the quartz crystal unit 2 may be considered to be formed in a circular shape as small as the connecting terminal 36 of the mounting board 3. The vibration characteristics of the quartz crystal unit 2 are measured using the external terminal 27 before being bonded on the mounting board 3. If the external terminal 27 is small, the probe of measurement equipment is difficult to contact the external terminal 27. Hence, the external terminal 27 needs a certain size (area).

A need thus exists for a surface mount piezoelectric oscillator which is not susceptible to the drawback mentioned above.

SUMMARY

According to an aspect of this disclosure, there is provided a surface mount piezoelectric oscillator. The surface mount piezoelectric oscillator includes a piezoelectric resonator with a container main body, a plurality of external terminals, a mounting board with an IC chip, a plurality of connecting terminals, and a solder ball. The container main body has a bottom surface. The plurality of external terminals is disposed on the bottom surface. The IC chip constitutes an oscillator circuit. The plurality of connecting terminals is disposed on a top surface of the mounting board. The solder ball bonds the plurality of external terminals and the plurality of connecting terminals by melting and hardening. The external terminal of the piezoelectric resonator has a rectangular outer shape. A whole area of the plurality of external terminals occupies a large part of the bottom surface of the piezoelectric resonator. The connecting terminal of the mounting board has an outer shape approximately a circular shape. The outer shape is equal to or slightly smaller than a diameter of a solder ball placed in a connection process. The connecting terminal faces the external terminal of the piezoelectric resonator. The external terminal of the piezoelectric resonator includes a rectangular portion and a solder bonding portion. The solder bonding portion is separated from the rectangular portion on the bottom surface. The solder bonding portion has approximately a circular shape with approximately the same size as a size of the connecting terminal of the mounting board. The solder bonding portion is disposed in a position facing the connecting terminal. The solder ball placed on the connecting terminal of the mounting board is melted, self-aligned, and hardened so as to form a solder fillet of nearly axial symmetry. The solder fillet bridges between the both electrodes and bonds the connecting terminal of the mounting board and the solder bonding portion of the external terminal of the piezoelectric resonator.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Embodiments applied to the crystal oscillator disclosed here will be explained with reference to the attached drawings.

Embodiment 1

Figure 1:
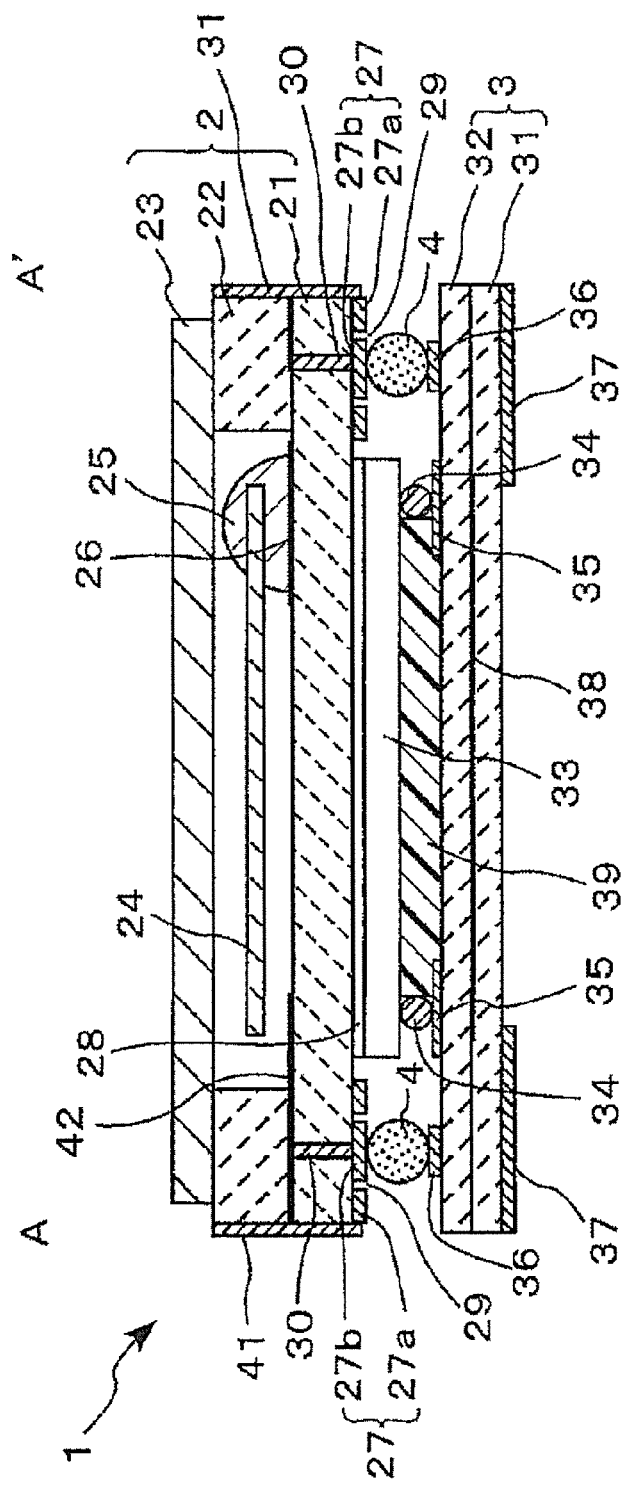
FIG. 1 is a cross-sectional view illustrating a solder ball before melted in a surface mount crystal oscillator according to Embodiment 1 of this disclosure.

FIG. 1 is a cross-sectional view illustrating a surface mount crystal oscillator that is a surface mount piezoelectric oscillator of Embodiment 1 according to this disclosure. A crystal oscillator 1 according to Embodiment 1 includes a quartz crystal unit 2 and a mounting board 3 with an IC chip 33. The quartz crystal unit 2 includes a container main body that includes a bottom wall layer 21 and a frame wall layer 22. The container main body houses a crystal element 24 in a depressed portion surrounded by the frame wall layer 22. The crystal element 24 includes excitation electrodes (not shown) on both front and back surfaces of its thin piece. Extraction electrodes (similarly, not shown) extending from the excitation electrodes to one end edge are fixedly secured to a pair of crystal holding terminals 26 with a conductive adhesive 25. The pair of crystal holding terminals 26 is disposed on an inner bottom surface (one principal surface) of the depressed portion.

The depressed portion housing the crystal element 24 is hermetically sealed by a lid body 23 formed of a metal plate, thus forming a quartz crystal unit 2. Besides, the lid body 23 can employ a quartz plate, a ceramic plate, a hard resin plate, or a similar plate. For use of the metal plate as the lid body, the lid body 23 and the frame wall layer 22 are sealed by seam welding or similar method via a metal thin film similar to the lid body 23. The bottom wall layer 21 has an outside bottom surface (the other principal surface) on which a terminal (an external terminal 27) for connecting the mounting board 3 with the IC chip 33 is disposed. The external terminal 27 includes a test terminal portion 27a and a solder bonding portion 27b.

The mounting board 3 with the IC chip 33 employs a laminated substrate formed of a ceramic substrate 31 and ceramic substrate 32. In this example, although the mounting board 3 employs the laminated substrate, a single layer may be employed. One principal surface (an IC chip mounting surface) of the mounting board 3 includes a plurality of connecting terminals 36 that connect a plurality of wiring patterns, the electrode pads 35, and the crystal oscillator 1. The other principal surface (the mounting surface) of the mounting board 3 has a plurality of mounting terminals 37 to be mounted on the electronic equipment to apply. In this example, a ground layer 38 (a shield layer) that provides an electromagnetic shielding function is disposed between the ceramic substrate 31 and ceramic substrate 32. The ground layer 38 is connected to a ground pattern (not shown) disposed in the mounting board.

Figure 2:
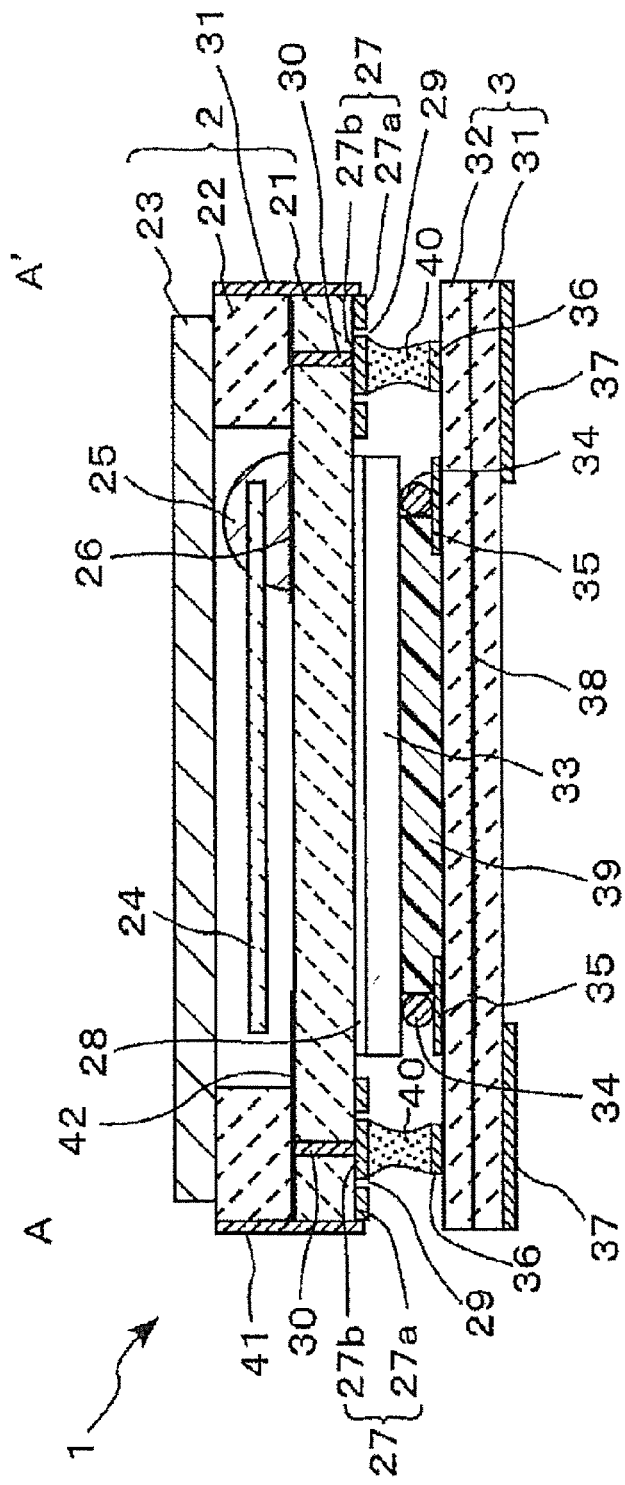
FIG. 2 is a cross-sectional view illustrating a solder ball after melting and hardening in the surface mount crystal oscillator according to Embodiment 1 of this disclosure.

FIG. 2 is a cross-sectional view illustrating a solder ball after melting and hardening in the surface mount crystal oscillator according to Embodiment 1 of this disclosure. In FIG. 2, a melted and hardened solder becomes a solder pillar 40 forming a solder fillet of nearly axial symmetry. The solder pillar 40 fixedly secures the quartz crystal unit and the mounting board in a correct position strongly.

Figure 3:
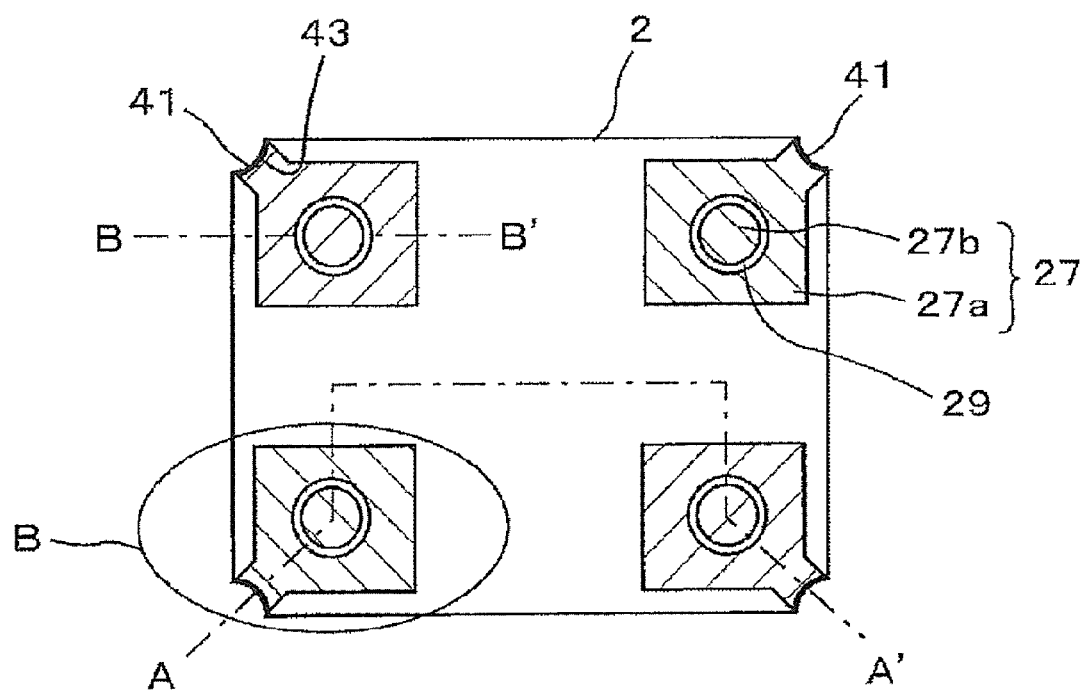
FIG. 3A is a plan view of terminals in a quartz crystal unit according to Embodiment 1 of this disclosure.
FIG. 3B is a plan view of a circuit pattern formed in a mounting board according to Embodiment 1 of this disclosure.
Figure 3:
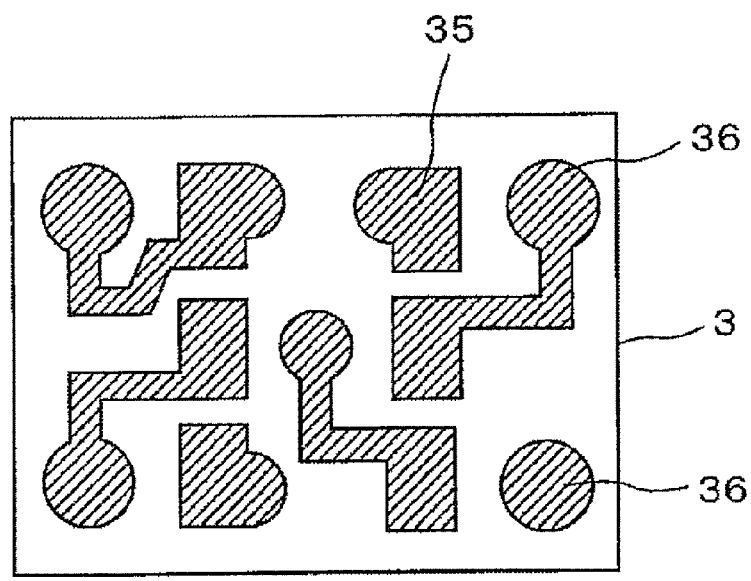

FIG. 3A is a plan view of a bottom surface of a container main body of the quartz crystal unit in the surface mount crystal oscillator of the surface mount piezoelectric oscillator according to Embodiment 1 of this disclosure. FIG. 3B is a plan view of a connection surface of the mounting board with an IC chip to be mounted on the quartz crystal unit in the surface mount crystal oscillator of the surface mount piezoelectric oscillator according to Embodiment 1 of this disclosure. The cross-sectional surface taken along the single dot chain line A-A' in FIG. 3A corresponds to FIG. 1. The external terminals 27 are disposed on the bottom surface of the container main body of the quartz crystal unit 2. The external terminal 27 is disposed on each corner portion of the bottom surface in a rectangular shape (four in total) in Embodiment 1. The sum of the areas of these external terminals 27 occupies a large part of the area on the bottom surface.

On the connection surface (the mounting surface) of the mounting board 3 with the IC chip to be mounted on the quartz crystal unit, a plurality of connecting terminals 36 connected to the external terminals 27 of the quartz crystal unit 2 and a plurality of wiring patterns and electrode pads 35 disposed adjacent to the connecting terminals 36 are formed as illustrated in FIG. 3B. The connecting terminals 36, the wiring patterns, and the electrode pad 35 are connected to the IC chip 33 and the mounting terminal 37 through a through-hole or a via hole (not shown), which are disposed on the mounting board 3.

In Embodiment 1, the external terminal 27 on the bottom surface of the container main body of the quartz crystal unit 2 includes a test terminal portion 27a and a solder bonding portion 27b. The solder bonding portion 27b also becomes a portion that contacts a probe. The solder bonding portion 27b is located at the center of the test terminal portion 27a and disposed so that the solder bonding portion 27b may be electrically and structurally separated from the test terminal portion 27a using an electrode material absence portion 29. The solder bonding portion 27b has approximately the same size or slightly larger than the connecting terminal 36 of the mounting board 3, and the same approximately circular shape as that of the connecting terminal 36. The solder bonding portion 27b is formed in a position facing the connecting terminal 36. In FIG. 3A, although the solder bonding portion 27b is disposed at the center of the test terminal portion 27a, the solder bonding portion 27b is not necessary to be at the center position. The solder bonding portion 27b may be formed at a suitable position corresponding to the location of the connecting terminal 36 of the mounting board 3.

Figure 4:
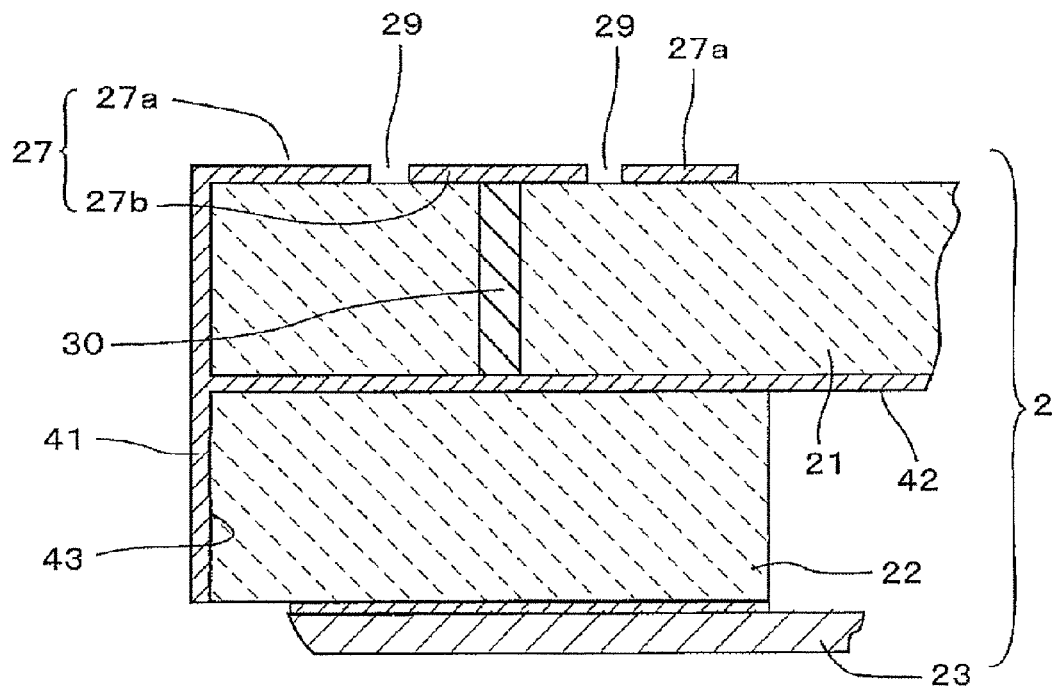
FIG. 4 is an enlarged cross-sectional view of the portion of the external terminal that constitutes the main portion of the quartz crystal unit in FIG. 1 taken along the line IV-IV of FIG. 3A.

FIG. 4 is an enlarged cross-sectional view of the portion of the external terminal that constitutes the main portion of the quartz crystal unit in FIG. 1 taken along the line B-B' of FIG. 3A. This cross-sectional view corresponds the portion B in FIG. 3A. Note that this cross-sectional view is upside down of FIG. 1. As described above, the external terminal 27 includes the test terminal portion 27a and the solder bonding portion 27b.

The sidewall of the container main body that constitutes the quartz crystal unit 2 (the corner sidewall in this embodiment) has a so-called castellation 43 (a notch) as illustrated in FIG. 3A. The castellation 43 has a depressed sidewall that includes a conductive connection path 41. The conductive connection path 41 is connected to a wiring pattern 42 that connects the test terminal portion 27a to the crystal holding terminal 26. The solder bonding portion 27b is connected to the wiring pattern 42, which is a conductive path of a via hole 30 formed in the frame wall layer 22. This electrically integrates the test terminal portion 27a and the solder bonding portion 27b. Accordingly, bringing a measuring probe in contact with the test terminal portion 27a allows the electrical measurement of the quartz crystal unit. Accordingly, the test terminal portion 27a remains the large area, thus facilitating measurement. Since the solder remains in the solder bonding portion 27b with an approximately circular shape, a hardened solder layer does not exist in the test terminal portion 27a. Thus, the above-described solder crack does not occur.

Figure 5:
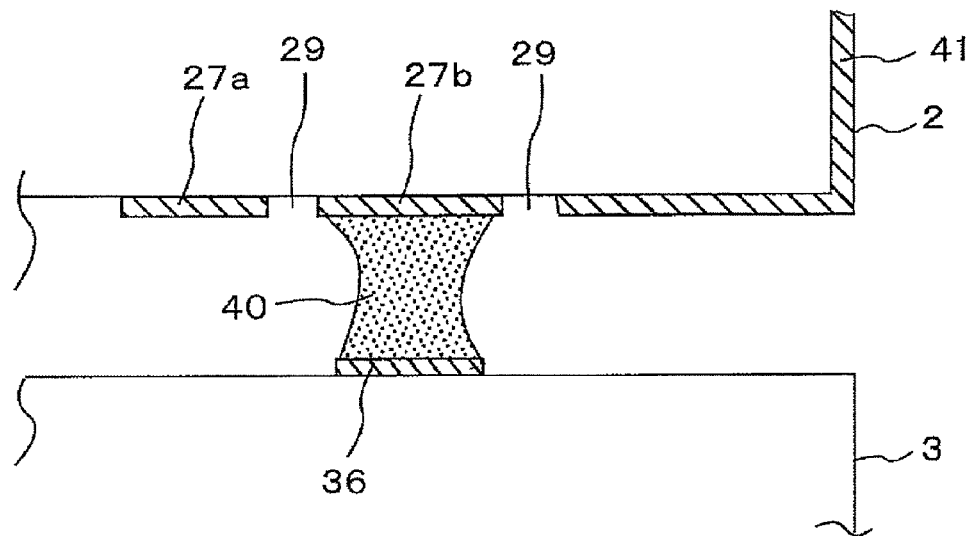
FIG. 5 is a schematic cross-sectional view of the main part illustrating a state where the external terminal and the connecting terminal in FIG. 2 are bonded by melting and hardening of a solder ball.

FIG. 5 is a schematic cross-sectional view illustrating a state where the external terminal and the connecting terminal, which constitute the quartz crystal unit of FIG. 1, are bonded by melting and hardening of a solder ball. This bonding is performed as follows. The solder ball is placed on the connecting terminal 36 of the mounting board 3 with the IC chip. Then, the external terminal 27 of the container main body of the quartz crystal unit 2 is positioned. Subsequently, these members pass through a reflow furnace. At this time, the top of the solder ball is pressed to the solder bonding portion 27b of the external terminal 27. The reflow process melts the solder ball. The melted solder spreads and wets both surfaces on the connecting terminal 36 and the solder bonding portion 27b. At this time, a surface energy (a surface tension) of the melted solder acts such that the surface area of the melted solder becomes minimal. This works the connecting terminal 36 of the mounting board 3 and the external terminal 27 of the quartz crystal unit 2 to be at the same axis, thus making the both self-aligned.

That is, in the reflow process, the melted solder does not reach the test terminal portion 27a because of the existence of the electrode material absence portion 29 formed between the solder bonding portion 27b and the test terminal portion 27a. The melted solder almost uniformly spreads and wets the surfaces of the solder bonding portion 27b and the connecting terminal 36, which have approximately the same area and the same shape. The melted solder forms a bridge between the both electrodes by the above-described self-alignment and hardening with nearly axial symmetry. After the solder exits the reflow furnace and hardens, a solder pillar with a good solder fillet, which has a cylindrical shape narrowed in the middle and nearly axial symmetry as illustrated in FIG. 5 as the reference numeral 40, is formed. Then, the both electrodes are strongly bonded.

This embodiment allows the quartz crystal unit and the mounting board with the IC chip to be equally and strongly connected, and the electrical characteristic of the quartz crystal unit is efficiently and surely measured. This restricts a generation of solder crack and improves fabrication yield, thus providing a surface mount piezoelectric oscillator using a highly-reliable crystal oscillator or similar component.

Embodiment 2

Figure 6:
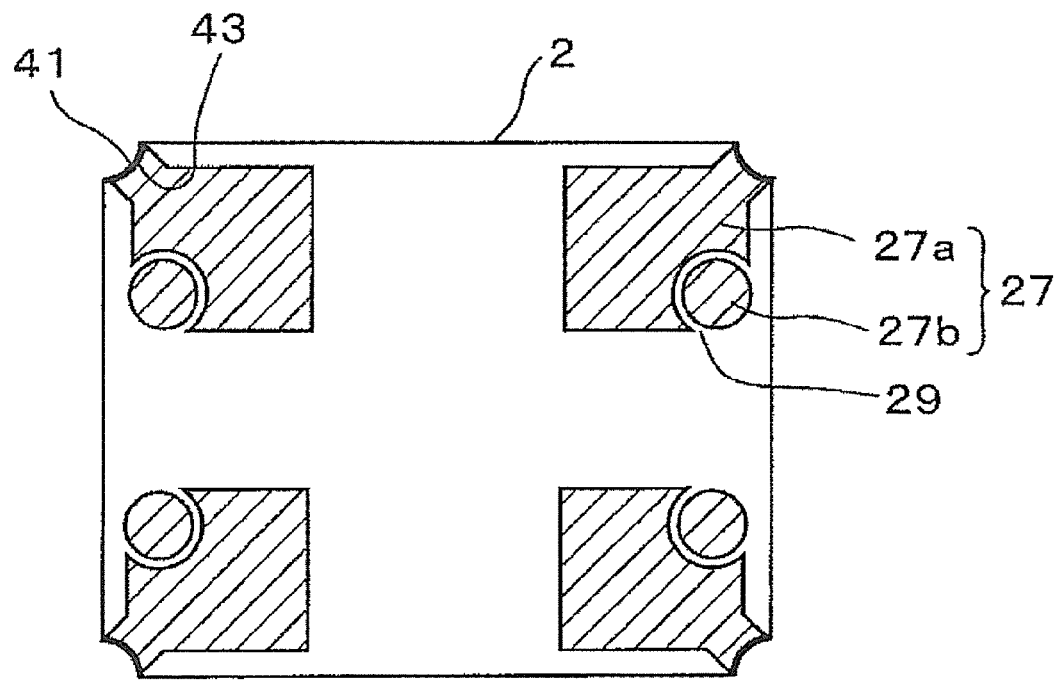
FIG. 6A is a plan view of a bottom surface of a container main body of the quartz crystal unit constituting a surface mount crystal oscillator according to Embodiment 2 of this disclosure.
FIG. 6B is a plan view of a connection surface between the quartz crystal unit and a mounting board with an IC chip constituting the surface mount crystal oscillator according to Embodiment 2 of this disclosure.
Figure 6:
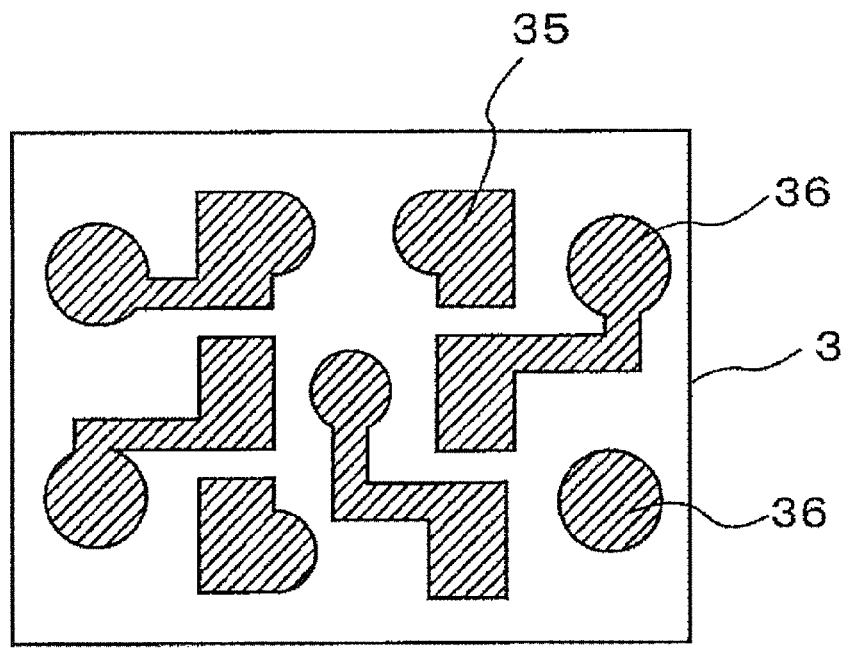
Figure 7:
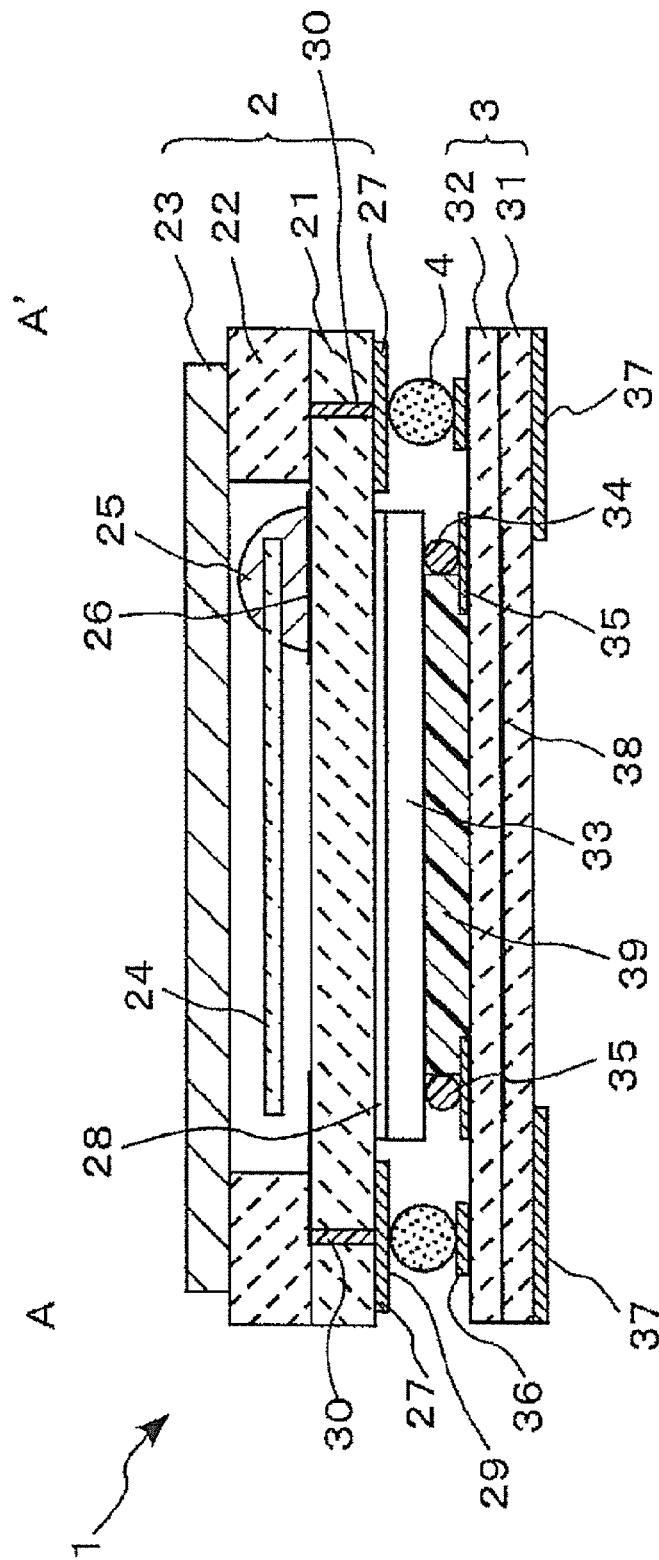
FIG. 7 is an exemplary schematic cross-sectional view illustrating one exemplary configuration of a crystal oscillator as an example of a surface mount piezoelectric oscillator of the related art.

FIG. 6A is a plan view of a bottom surface of a container main body of the quartz crystal unit constituting a surface mount crystal oscillator according to Embodiment 2 of this disclosure. FIG. 6B is a plan view of a connection surface of the quartz crystal unit to be mounted on the mounting board with the IC chip constituting the surface mount crystal oscillator of Embodiment 2 of this disclosure. The external terminals 27 are disposed on the bottom surface of the container main body of the quartz crystal unit 2. The external terminal 27 is disposed on each corner portion of the bottom surface in a rectangular shape (four in total) in Embodiment 2 as well. The sum of the sizes of these external terminals 27 occupies a large part of the area on the bottom surface.

On the connection surface (the mounting surface) of the mounting board 3 with the IC chip to be mounted on the quartz crystal unit, a plurality of connecting terminals 36 connected to the external terminals 27 of the quartz crystal unit 2 and a plurality of wiring patterns and electrode pads 35 disposed close to the connecting terminals 36 are formed. The connecting terminals 36, the wiring patterns, and the electrode pad 35 are connected to the IC chip 33 and the mounting terminal 37 through a through-hole or a via hole (not shown), which are disposed on the mounting board 3 similar to Embodiment 1.

Embodiment 2 is similar to Embodiment 1 in that the external terminal 27 on the bottom surface of the container main body of the quartz crystal unit 2 includes the test terminal portion 27a and the solder bonding portion 27b. However, in Embodiment 2, the solder bonding portion 27b is disposed such that a part of the solder bonding portion 27b is included in each corner portion of the test terminal portion 27a in an approximately rectangular shape. The solder bonding portion 27b and the test terminal portion 27a are arranged to be electrically and structurally separated on the planar surface of the external terminal 27 using the electrode material absence portion 29. Similarly to the connecting terminal 36 of the mounting board 3, the solder bonding portion 27b has approximately the circular shape and approximately the same size or slightly larger than the connecting terminal 36. The solder bonding portion 27b is formed in a position facing the connecting terminal 36 at the same position. In FIG. 6A, although the solder bonding portion 27b is disposed at the position along the outer side of the test terminal portion 27a, the solder bonding portion 27b is not necessary to be disposed at such a symmetrical part. The solder bonding portion 27b may be formed at a suitable position corresponding to the location of the connecting terminal 36 of the mounting board 3.

In the reflow process of Embodiment 2, the melted solder does not reach the test terminal portion 27a because of the existence of the electrode material absence portion 29 formed between the solder bonding portion 27b and the test terminal portion 27a, similarly to Embodiment 1. After exiting the reflow furnace and hardens, the melted solder forms a bridge between the both electrodes by self-alignment and hardening with nearly axial symmetry. Similarly to Embodiment 1, a solder pillar with a good solder fillet, which has a cylindrical shape narrowed in the middle and nearly axial symmetry as illustrated in FIG. 5 as the reference numeral 40, is formed. Then, the both electrodes are strongly bonded.

This embodiment allows the quartz crystal unit and the mounting board with the IC chip to be equally and strongly connected, and the electrical characteristic of the quartz crystal unit is efficiently and surely measured. This improves fabrication yield to provide a surface mount piezoelectric oscillator using a highly-reliable crystal oscillator or similar.

In Embodiments described above, a mounting bump 34 (such as a gold bump) of the IC chip 33 is fixedly secured to the electrode pad 35 by ultrasonic thermo-compression bonding or a similar method. Further, an adhesive layer, which is preferably an epoxy resin, or an underfill layer may be filled between the IC chip 33 and the mounting board 3. The other principal surface of the quartz crystal unit and the IC chip is preferably bonded by an adhesive such as an epoxy resin.

This disclosure is not limited to mounting of a piezoelectric resonator such as a quartz crystal unit on a mounting board described in Embodiments. The disclosure is similarly applicable to bonding of a SAW element and a mounting board with the IC chip in a composite component such as a SAW filter.

To achieve described above, this disclosure may also include the following configuration. All of or a part of the external terminal of the quartz crystal unit is separated from the rectangular portion and included in the rectangular portion. The solder bonding portion has approximately a circular shape with approximately the same size as a size of the connecting terminal of the mounting board. The solder bonding portion is disposed in a position facing the connecting terminal. The solder ball placed on the connecting terminal of the mounting board is melted and hardened so as to provide bonding between the connecting terminal and the solder bonding portion of the external terminal of the quartz crystal unit.

More specifically, the external terminal of the quartz crystal unit has an outer shape in an approximately rectangular shape. The whole area of a plurality of external terminals occupies a large part of the area of the bottom surface of the quartz crystal unit. The connection with the solder ball on the external terminal of the quartz crystal unit (the solder bonding) has an approximately circular shape. The shape has a diameter that is approximately equal to or slightly smaller than a diameter of the solder ball (approximately 80 percent of the diameter of the solder ball). A connection interval between the quartz crystal unit and the mounting board is specified by bringing the IC chip mounted on the mounting board in contact with the bottom surface of the quartz crystal unit directly or by an adhesive.

The whole region including the solder bonding portion of the external terminal of the quartz crystal unit is defined as a test terminal portion of the quartz crystal unit. The solder bonding portion can be disposed such that all of or a part of the solder bonding portion is included in the external terminals in an approximately rectangular shape. The quartz crystal unit includes a conductive connection path in an inside surface of the container main body and connects to the solder bonding portion through a via hole. The conductive connection path electrically connects the via hole, which connects to the solder bonding, and the test terminal portion on a side surface of the container main body.

Figure 8:
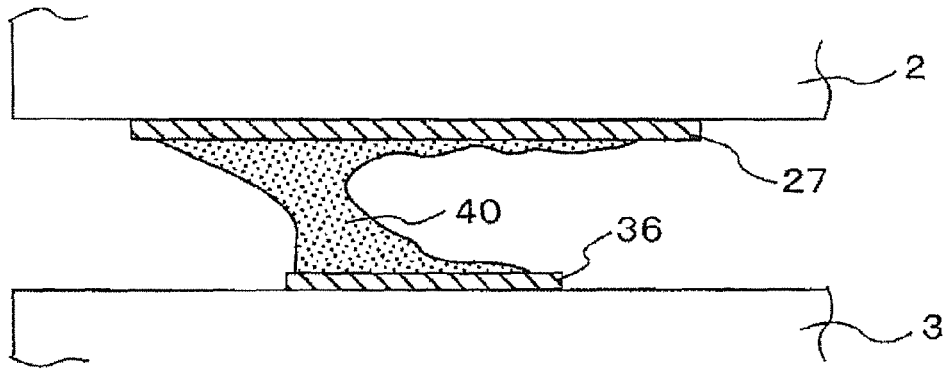
FIGS. 8A to 8C are schematic views illustrating a typical example of poor bonding state in a reflow bonding of the solder ball that connects the quartz crystal unit and the mounting board with the IC chip in the configuration in FIG. 7.
Figure 8:
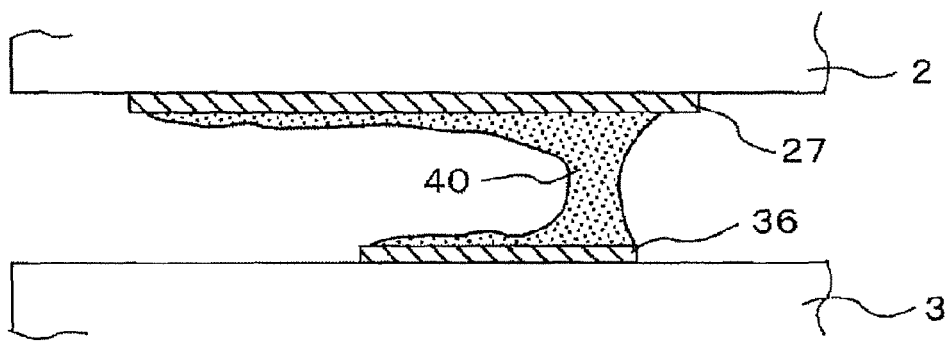
Figure 8:
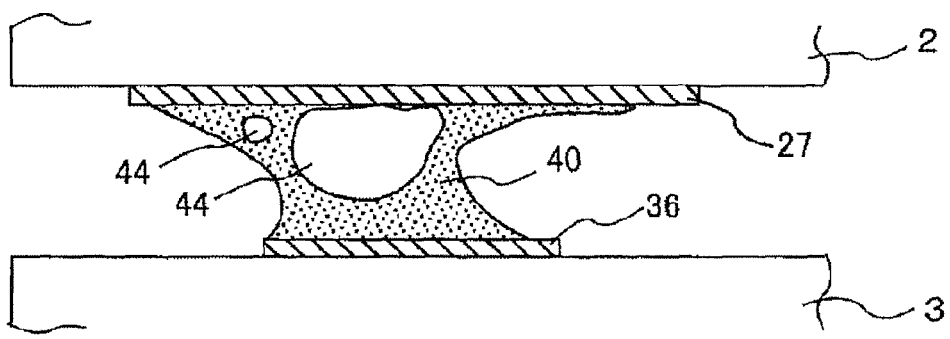

The solder, which is melted between the connecting terminal of the mounting board and the external terminal of the quartz crystal unit, spreads and wets the surfaces of the external terminal and the solder bonding portion. The surfaces of external terminal and the solder bonding portion are between the connecting terminal of the mounting board and the solder bonding portion of the external terminal of the quartz crystal unit. The surface sizes of the external terminal and the solder bonding portion are approximately the same or slightly narrow. Accordingly, surface energy of the melted solder self-aligns the positions of the external terminal of the quartz crystal unit and the connecting terminal of the mounting board. The melted solder spreads and wets equally on surfaces of the solder bonding portion of the external terminal and the connecting terminal of the mounting board. This avoids a failure as illustrated in FIGS. 8A to 8C. That is, when the solder hardens after the reflow process, a solder bonding portion is formed between the external terminal and the solder bonding. The solder bonding portion forms a cylindrical shape narrowed in the middle and has a fillet with an approximately even shape.

In this disclosure, compared with the external terminal of the quartz crystal unit formed in a circular shape, which has approximately the same size as that of the connecting terminal of the mounting board, alone in order to limit the wet region of the solder, the whole surface of the external terminal with wide size including the solder bonding portion and the test terminal portions as a portion which contacts a test probe for measuring a characteristic of the quartz crystal unit, thus facilitating the measuring operation.

With this disclosure, the quartz crystal unit and the mounting board are equal, correctly disposed, and strongly connected, and the electrical characteristic of the quartz crystal unit can be measured surely and efficiently. This improves the fabrication yield and can provide a surface mount piezoelectric oscillator as a highly-reliable crystal oscillator.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface mount piezoelectric oscillator, comprising:
a piezoelectric resonator with a container main body, the container main body having a bottom surface;
a plurality of external terminals, disposed on the bottom surface;
a mounting board with an IC chip, the IC chip constituting an oscillator circuit;
a plurality of connecting terminals, disposed on a top surface of the mounting board; and
a solder ball, bonding the plurality of external terminals and the plurality of connecting terminals by melting and hardening,
wherein, the external terminal of the piezoelectric resonator has a rectangular outer shape, a whole area of the plurality of external terminals occupying a large part of the bottom surface of the piezoelectric resonator, and
the connecting terminal of the mounting board has an outer shape approximately a circular shape, the outer shape being equal to or slightly smaller than a diameter of the solder ball placed in a connection process, the connecting terminal facing the external terminal of the piezoelectric resonator,
wherein, the external terminal of the piezoelectric resonator includes:
a rectangular portion; and
a solder bonding portion, being separated from the rectangular portion by an electrode material absence portion on the bottom surface, the solder bonding portion having approximately a circular shape with approximately a same size as a size of the connecting terminal of the mounting board, the solder bonding portion being disposed in a position facing the connecting terminal,
wherein, the solder ball placed on the connecting terminal of the mounting board is melted, self-aligned, and hardened so as to form a solder fillet, the solder fillet bridging between an electrode of the mounting board and an electrode of the external terminal and bonding the connecting terminal of the mounting board and the solder bonding portion of the external terminal of the piezoelectric resonator, wherein the solder fillet does not cover the electrode material absence portion such that the solder fillet is of nearly axial symmetry.

2. The surface mount piezoelectric oscillator according to claim 1, wherein,
a part other than the solder bonding portion of the external terminal of the piezoelectric resonator forms a test terminal portion of the piezoelectric resonator.

3. The surface mount piezoelectric oscillator according to claim 1, wherein, all of the solder bonding portion is included in the rectangular portion.

4. The surface mount piezoelectric oscillator according to claim 1, wherein, a part of the solder bonding portion is included in the rectangular portion.

5. The surface mount piezoelectric oscillator according to claim 1, wherein,
the piezoelectric resonator includes a conductive connection path on an inside and a side surface of the container main body,
the conductive connection path electrically integrates the solder bonding portion to a test terminal portion.

* * * * *